United States Patent [19]

Kim et al.

[11] Patent Number: 6,140,223
[45] Date of Patent: *Oct. 31, 2000

[54] METHODS OF FORMING CONTACTS FOR INTEGRATED CIRCUITS USING CHEMICAL VAPOR DEPOSITION AND PHYSICAL VAPOR DEPOSITION

[75] Inventors: Jeong-Seok Kim, Kyunggi-do; Joo-Wook Park, Seoul, both of Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/175,698

[22] Filed: Oct. 20, 1998

[30] Foreign Application Priority Data

Nov. 25, 1997 [KR] Rep. of Korea .................. 97-62866

[51] Int. Cl.[7] .................................................. H01L 21/4763
[52] U.S. Cl. ........................ 438/629; 438/627; 438/628; 438/639; 438/648
[58] Field of Search ..................... 438/639, 629, 438/637, 648, 652, 672, 627, 625, 628, 680

[56] References Cited

U.S. PATENT DOCUMENTS

| | | | |
|---|---|---|---|
| 5,571,751 | 11/1996 | Chung | 437/187 |
| 5,572,071 | 11/1996 | Lee | 257/751 |
| 5,780,356 | 7/1998 | Kim | 438/627 |
| 5,895,267 | 4/1999 | Zhao et al. | 438/627 |
| 5,911,857 | 6/1999 | Kim | 204/192.15 |
| 5,913,145 | 6/1999 | Lu et al. | 438/643 |
| 5,970,374 | 10/1999 | Teo | 438/629 |
| 5,972,179 | 10/1999 | Chittipeddi et al. | 204/192.17 |
| 5,994,181 | 11/1999 | Hsie et al. | 438/239 |

OTHER PUBLICATIONS

Wolf, S., Silicon Processing for the VLSI Era, vol. 1: Process Technology. Lattice Press, pp. 56–58, 1986.

*Primary Examiner*—Donald L. Monin, Jr.
*Assistant Examiner*—Ginette Peratta
*Attorney, Agent, or Firm*—Myers Bigel Sibley & Sajovec

[57] ABSTRACT

A thin conductive layer is formed on a contact hole bottom and on a contact hole sidewall in an insulating layer on an integrated circuit substrate, and then both chemical vapor deposition and physical vapor deposition are performed, to form a glue layer on the thin conductive layer. By performing both chemical vapor deposition and physical vapor deposition, the desirable characteristics of both processes may be obtained and the drawbacks in each of these processes may be compensated. Preferably, chemical vapor deposition of a material is performed, and physical vapor deposition of the same material is performed, to form the glue layer on the thin conductive layer. More particularly, chemical vapor deposition of titanium nitride, and physical vapor deposition of titanium nitride may be performed to form the glue layer on the thin conductive layer. As an alternative to titanium nitride, tungsten nitride may be used. After forming the glue layer, the contact hole may be filled with conductive material such as tungsten.

14 Claims, 3 Drawing Sheets

METHODS OF FORMING CONTACTS FOR INTEGRATED CIRCUITS USING CHEMICAL VAPOR DEPOSITION AND PHYSICAL VAPOR DEPOSITION

FIELD OF THE INVENTION

This invention relates to microelectronic devices and fabrication methods therefor, and more specifically to contacts for integrated circuit devices and methods of fabrication thereof.

BACKGROUND OF THE INVENTION

As the integration density of integrated circuits continues to increase, the physical dimensions of the feature sizes of the integrated circuits may continue to decrease. As is well known to those having skill in the art, integrated circuits generally include an integrated circuit substrate such as a monocrystalline silicon substrate in which active devices such as transistors are formed. A plurality of conductive layers are formed on the integrated circuit substrate, insulated from one another by insulating layers. Contacts are formed in contact holes in the insulating layers to selectively electrically connect the conductive layers to one another and to the underlying integrated circuit substrate.

As the feature size of integrated circuits continues to decrease, the size of the contact holes may also decrease. Moreover, the depth of the contact hole may increase or stay relatively constant so that the aspect ratio of the contact hole may increase. It may thus be increasingly difficult to form low resistivity contacts in these high aspect ratio contact holes.

More specifically, FIG. 1 illustrates a contact hole 3 with a sloped profile that is formed in an insulating layer 2 on an integrated circuit substrate 1. As the integration density continues to increase, it is generally desirable to provide a vertical profile contact hole 4 as shown in FIG. 2, to permit higher density contact holes. The use of a vertical profile, in addition to the high aspect ratio, may make it more difficult to form high performance contacts in the contact hole.

FIG. 3 is a cross-sectional view of a conventional integrated circuit contact formed using a conventional fabrication method. As shown in FIG. 3, a contact hole 14 is provided in an interlayer dielectric layer 12 that is formed on an integrated circuit substrate 10. A titanium (Ti) layer is formed in the contact hole 14 including on the contact hole bottom and the contact hole sidewall. A titanium nitride (TiN) layer is formed on the titanium layer to act as a glue layer or wetting layer. The combination of the titanium layer and titanium nitride layer form a barrier layer 16. The contact hole may then be filled by a metal such as tungsten (W).

Unfortunately, when filling the contact hole with tungsten, the tungsten hexafluoride ($WF_6$) source gas may react with the underlying titanium layer or with a titanium silicide layer that is formed by reaction of the titanium layer with the integrated circuit substrate 10, to form an insulating layer such as a titanium fluoride layer. The titanium fluoride layer may increase the contact resistance and may cause stress due to volume expansion on the underlying integrated circuit substrate. The increased contact resistance and stress may increase the leakage current and/or cause other defects. Moreover, an edge portion 17 between the bottom and sidewall of the contact hole 14 may have a thin layer of the barrier metal 16 compared to other portions of the contact hole. Finally, when the titanium nitride layer is formed by sputtering, it may include columnar crystals, which may form columnar grain boundaries. These columnar grain boundaries may promote intergranular diffusion and thereby degrade the characteristics of the barrier metal layer.

In order to overcome these and/or other problems, Chemical Vapor Deposition (CVD) has been used to form the titanium nitride layer. Although CVD can provide a good step coverage, the CVD titanium nitride layer may be less dense, thereby degrading the characteristics of the barrier metal layer. Moreover, if titanium chloride is used as a source gas for forming the CVD titanium nitride layer, the chlorine in the source gas may attack the underlying integrated circuit substrate 10.

Alternatively, the titanium layer may be formed by Physical Vapor Deposition (PVD) methods such as sputtering. However, when using PVD, an undesirable titanium oxide layer may be formed. Accordingly, both the CVD process and the PVD process may introduce problems in forming high performance and reliable contacts for integrated circuit devices.

SUMMARY OF THE INVENTION

It is therefore an object of the present invention to provide improved methods of forming contacts for integrated circuit substrates and contacts so formed.

It is another object of the present invention to provide contacts and contact forming methods that can provide low resistivity.

It is still another object of the present invention to provide integrated circuit contacts and contact forming methods that can provide high reliability.

These and other objects are provided according to the present invention by forming a thin conductive layer on a contact hole bottom and on a contact hole sidewall in an insulating layer on an integrated circuit substrate, and then performing both chemical vapor deposition and physical vapor deposition, to form a glue layer on the thin conductive layer. By performing both chemical vapor deposition and physical vapor deposition, the desirable characteristics of both processes may be obtained and the drawbacks in each of these processes may be compensated.

Preferably, chemical vapor deposition of a material is performed, and physical vapor deposition of the same material is performed, to form the glue layer on the thin conductive layer. More particularly, chemical vapor deposition of titanium nitride and physical vapor deposition of titanium nitride may be performed to form the glue layer on the thin conductive layer. As an alternative to titanium nitride, tungsten nitride may be used. The thin conductive layer may comprise titanium, cobalt and/or zirconium on the contact hole bottom and on the contact hole sidewall, and chemical vapor deposition may be used to form the thin conductive layer. After forming the glue layer, the contact hole may be filled with conductive material such as tungsten.

In a preferred embodiment of methods according to the present invention, a contact is formed in a contact hole of an insulating layer on an integrated circuit substrate by forming a thin conductive layer on the contact hole bottom and on the contact hole sidewall. A first glue layer is formed on the thin conductive layer. A second glue layer is formed on the first glue layer. A third glue layer is formed on the second glue layer. Preferably, the thin conductive layer, first glue layer and third glue layer are formed using physical vapor deposition, and the second glue layer is formed using chemical vapor deposition. The first glue layer and third glue layer are preferably formed using physical vapor deposition of titanium nitride and/or tungsten nitride and the second glue layer is preferably formed using chemical vapor deposition of titanium nitride and/or tungsten nitride. After forming the third glue layer, the contact hole is filled with conductive material such as tungsten.

In alternative embodiments, grain boundary stuffing is performed after forming the first glue layer and the second glue layer. Grain boundary stuffing may be performed by forming titanium oxide on the first and second glue layers. In another embodiment, a diffusion barrier layer is formed between the first glue layer and the second glue layer, and between the second glue layer and the third glue layer. The diffusion barrier layers may comprise silicon nitride layers that may be formed by rapid thermal nitration.

Integrated circuit contacts according to the invention comprise an insulating layer on an integrated circuit substrate, including therein a contact hole having a contact hole bottom and a contact hole sidewall. A thin conductive layer is provided on the contact hole bottom and on the contact hole sidewall. A first glue layer comprising PVD titanium nitride and/or PVD tungsten nitride is provided on the thin conductive layer. A second glue layer comprising CVD titanium nitride and/or CVD tungsten is provided on the first glue layer. A third glue layer comprising PVD titanium nitride and/or PVD tungsten nitride is provided on the second glue layer. A conductive material such as tungsten may be provided on the third glue layer, filling the contact hole. Accordingly, multiple glue layers may be formed using both chemical and physical vapor deposition, to thereby allow improved characteristics including improved step coverage.

DETAILED DESCRIPTION OF PREFERRED EMBODIMENTS

Figure 1:
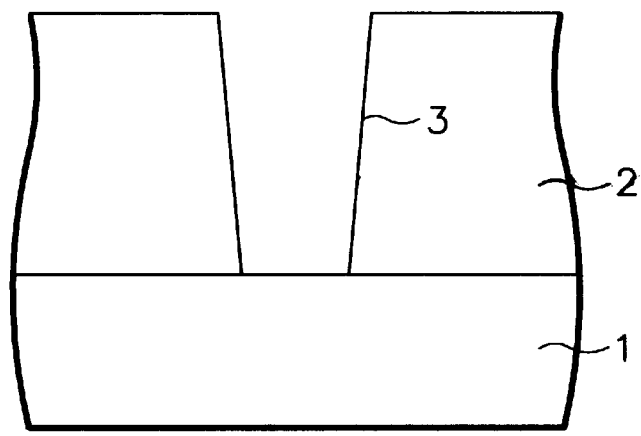
FIG. 1 is a cross-sectional view of a conventional sloped contact hole.
Figure 2:
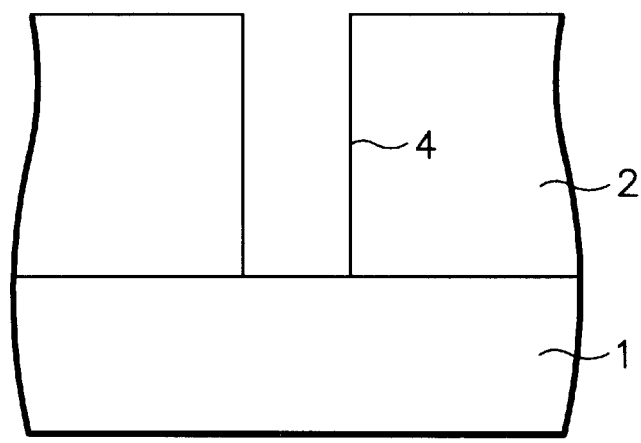
FIG. 2 is a cross-sectional view of a conventional vertical contact hole.
Figure 3:
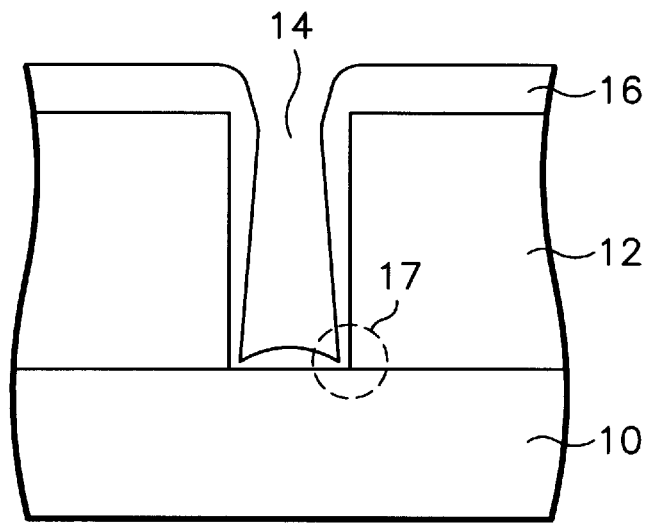
FIG. 3 is a cross-sectional view of a conventional integrated circuit contact.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 4:
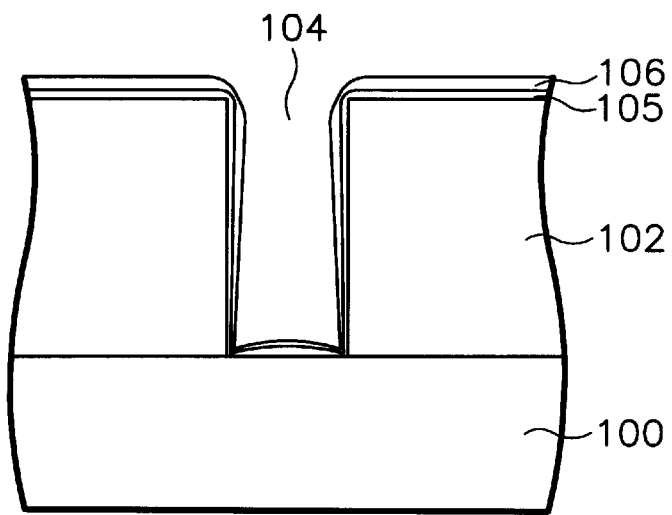
FIGS. 4–6 are cross-sectional views of integrated circuit contacts according to the present invention during intermediate fabrication steps.

Referring now to FIG. 4, an interlayer dielectric layer 102 is formed on an underlying conductive layer 100. It will be understood that the underlying conductive layer 100 may be an integrated circuit substrate or may be a conductive layer that is formed on an integrated circuit substrate. A contact hole 104 is provided in the interlayer insulating layer 102 to expose the underlying conductive layer 100. Preferably, the contact hole 104 has a vertical profile, so as to increase the contact pitch and to allow wider overlaps. An in situ dry cleaning process may be conducted on the contact hole. Conventional methods of forming contact holes 104 may be used.

Still referring to FIG. 4, a thin conductive layer 105 is formed on the contact hole bottom and on the contact hole sidewall. The thin conductive layer 105 may also be formed on the interlayer dielectric layer 102 opposite the underlying conductive layer 100. The thin conductive layer 105 may comprise at least one of titanium (Ti), cobalt (Co) and zirconium (Zr), and may have a thickness of between about 30 Å and about 70 Å. When the underlying conductive layer is a silicon semiconductor substrate, the titanium layer on the contact hole bottom may react with the underlying silicon substrate to form titanium silicide that can provide an ohmic contact.

Still referring to FIG. 4, a first glue layer 106 preferably comprising at least one of titanium nitride (TiN) and tungsten nitride (WN) is formed on the thin conductive layer 105. The first glue layer can serve as a barrier layer that can prevent reaction between the titanium silicide layer and subsequent layers. The first glue layer may have a thickness of between about 20 Å and about 100 Å at the bottom of the contact hole 104. Both the thin conductive layer 105 and the first glue layer 106 are preferably formed using a physical vapor deposition technique such as sputtering.

Figure 5:
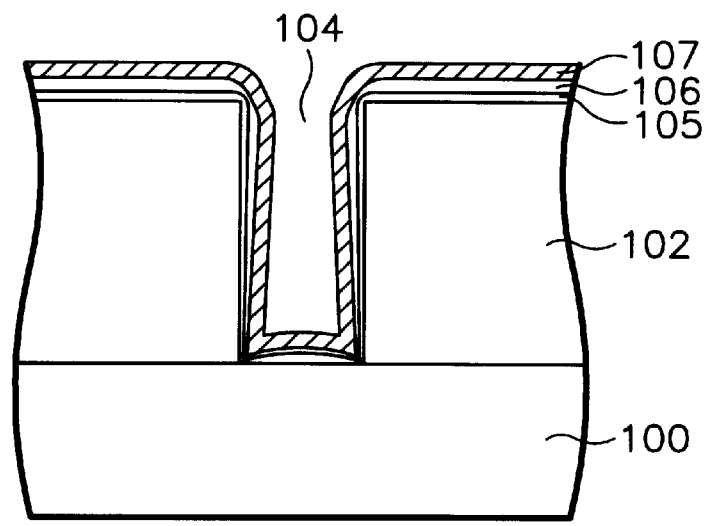

Referring now to FIG. 5, a second glue layer 107 is formed on the first glue layer 106. The second glue layer 107 preferably comprises at least one of titanium nitride and tungsten nitride and is formed using chemical vapor deposition. The second glue layer 107 may have a thickness of between about 20 Å and about 100 Å at the bottom of the contact hole 104.

Figure 6:
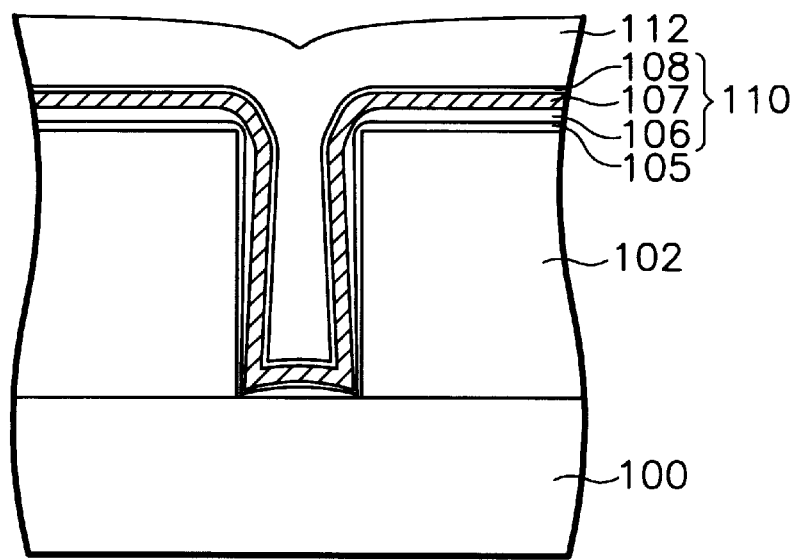

Referring now to FIG. 6, a third glue layer 108 is formed on the second glue layer 107. The third glue layer preferably comprises at least one of titanium nitride and tungsten nitride and is formed by physical vapor deposition. The third glue layer 108 may have a thickness of between about 20 Å and about 100 Å at the bottom of the contact hole 104.

Accordingly, a glue layer 110 is formed on the thin conductive layer 105 using both chemical vapor deposition and physical vapor deposition. As described, the glue layer 110 preferably comprises a first layer comprising PVD titanium nitride 106, a second layer comprising CVD titanium nitride 107, and a third layer comprising PVD titanium nitride 108. As known to those skilled in the art, PVD titanium nitride and CVD titanium nitride are different materials and do not merely denote different fabrication processes.

Preferably, the CVD titanium nitride layer 107 between the PVD titanium nitride layer 106 and the PVD titanium nitride layer 108 is formed to have grains that overlap with the overlying and underlying grain boundaries of the PVD titanium nitride layers 108 and 106 respectively. The multiple PVD and CVD nitride layers can provide good step coverage and high reliability and can serve as a barrier layer for gas diffusion.

In an alternative embodiment, the first and second titanium nitride layers 106 and 107 respectively may be exposed to air, to thereby form a natural titanium oxide layer that stuffs the grain boundaries thereof. Grain boundary stuffing can block gas diffusion pathways.

Moreover, a diffusion barrier may be formed between the first and second titanium nitride layers 106 and 107 and between the second and third titanium nitride layers 107 and 108, to thereby intensify the stuffing function, and further block diffusion gases. The diffusion barrier layer may be a nitride layer such as a silicon nitride layer that may be formed by rapid thermal nitridization.

Finally, as shown in FIG. 6, contact hole 104 is filled with a conductive layer 112 including but not limited to tungsten, aluminum and/or copper to fill the contact 104. The conductive layer 112 can be etched back as necessary.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a contact in a contact hole of an insulating layer on an integrated circuit substrate, the contact hole having a contact hole bottom and a contact hole sidewall, the method comprising the steps of:

forming a thin conductive layer on the contact hole bottom and on the contact hole sidewall; and serially performing a first physical vapor deposition, a chemical vapor deposition and a second physical vapor deposition to form a glue layer on the thin conductive layer.

2. A method according to claim 1 wherein the serially performing step comprises the step of serially performing a first physical vapor deposition of a material, a chemical vapor deposition of the same material and a second physical vapor deposition of the same material to form a glue layer on the thin conductive layer.

3. A method according to claim 1 wherein the serially performing step comprises the step of serially performing a first physical vapor deposition of titanium nitride, a chemical vapor deposition of titanium nitride and a second physical vapor deposition of titanium nitride to form a glue layer on the thin conductive layer.

4. A method according to claim 1 wherein the forming step comprises the step of forming a thin conductive layer comprising at least one of titanium, cobalt and zirconium on the contact hole bottom and on the contact hole sidewall.

5. A method according to claim 1 wherein the forming step comprises the step of:

performing chemical vapor deposition to form the thin conductive layer on the contact hole bottom and on the contact hole sidewall.

6. A method according to claim 1 wherein the serially performing step comprises the step of:

serially performing a first physical vapor deposition of a material comprising at least one of titanium nitride and tungsten nitride, a chemical vapor deposition of a material comprising at least one of titanium nitride and tungsten nitride and a second physical vapor deposition of a material comprising at least one of titanium nitride and tungsten nitride to form a glue layer on the thin conductive layer.

7. A method according to claim 1 wherein the serially performing step comprises the step of:

serially performing a first physical vapor deposition, a first grain boundary stuffing, a chemical vapor deposition, a second grain boundary stuffing and a second physical vapor deposition to form the glue layer on the thin conductive layer.

8. A method according to claim 1 wherein the following step is performed between the steps of performing a first physical vapor deposition and a chemical vapor deposition, and between the steps of performing a chemical vapor deposition and a physical vapor deposition:

forming a diffusion barrier.

9. A method according to claim 8 wherein the step of forming a diffusion barrier comprises the step of performing a rapid thermal nitration.

10. A method according to claim 1 wherein the performing step is followed by the step of:

filling the contact hole with conductive material.

11. A method of forming a contact in a contact hole of an insulating layer on an integrated circuit substrate, the contact hole having a contact hole bottom and a contact hole sidewall, the method comprising the steps of:

forming a thin conductive layer on the contact hole bottom and on the contact hole sidewall using physical vapor deposition;

forming a first glue layer on the thin conductive layer using physical vapor deposition;

forming a second glue layer on the first glue layer opposite the thin conductive layer using chemical vapor deposition; and forming a third glue layer on the second glue layer opposite the first glue layer using physical vapor deposition.

12. A method according to claim 11 wherein the steps of forming a first glue layer and forming a third glue layer are performed using physical vapor deposition of at least one of titanium nitride and tungsten nitride.

13. A method according to claim 12 wherein the step of forming a second glue layer is performed using chemical vapor deposition of at least one of titanium nitride and tungsten nitride.

14. A method according to claim 11 wherein the step of forming a third glue layer is followed by the step of:

filling the contact hole with conductive material.

* * * * *